United States Patent
Czarnik et al.

(10) Patent No.: US 6,284,650 B1
(45) Date of Patent: Sep. 4, 2001

(54) INTEGRATED TUNGSTEN-SILICIDE PROCESSES

(75) Inventors: Cory M. Czarnik, Mountain View; Vedapuram S. Achutharaman, Santa Clara; Mahalingam Venkatesan, San Jose; Klaus-Dieter Rinnen, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/969,627

(22) Filed: Nov. 13, 1997

Related U.S. Application Data

(63) Continuation of application No. 08/587,147, filed on Jan. 16, 1996, now abandoned.

(51) Int. Cl.$^7$ ................................................. H01L 21/4763
(52) U.S. Cl. ........................ 438/649; 438/655; 438/656; 438/680; 438/683; 438/685
(58) Field of Search .................. 427/255, 255.1, 427/255.2; 438/680, 683, 685, 649, 655, 656

(56) References Cited

U.S. PATENT DOCUMENTS

| | | | |
|---|---|---|---|
| 4,391,846 | 7/1983 | Raymond | 427/99 |
| 4,692,343 | 9/1987 | Price et al. | 427/38 |
| 4,737,474 | 4/1988 | Price et al. | 437/200 |
| 4,851,295 | 7/1989 | Brors | 428/45 |
| 4,966,869 | 10/1990 | Hillman et al. | 437/200 |
| 4,985,740 | 1/1991 | Shenai et al. | 357/23.4 |
| 5,183,510 | 2/1993 | Kimura | 118/719 |
| 5,194,404 * | 3/1993 | Nagatomo | 438/655 |
| 5,203,956 | 4/1993 | Hansen | 156/643 |
| 5,231,056 | 7/1993 | Sandhu | 437/200 |
| 5,428,244 | 6/1995 | Segawa et al. | 257/646 |
| 5,510,296 * | 4/1996 | Yen et al. | 437/200 |
| 5,558,910 * | 9/1996 | Telford et al. | 427/255 |

OTHER PUBLICATIONS

Clark, T.E., et al.; "High Pressure Blanket CVD Tungsten"; *Mat. Res. Soc. symp. Proc. VLSI V*. (1990); pp. 167–178.

Hara, T., et al.; "Surface Reaction of Tungsten Silicide Deposition Using Dichlorrrosilane Reduction of Tungsten Hexafluoride"; *Mat. Res. Soc. Symp. Proc. VLSI V*. (1990); pp. 399–405.

(List continued on next page.)

*Primary Examiner*—Charles Bowers
*Assistant Examiner*—Renee'R. Berry
(74) *Attorney, Agent, or Firm*—Blakely Sokoloff Taylor & Zafman

(57) ABSTRACT

A method of forming a silicide on a silicon layer. First, a monosilane based tungsten-silicide layer is formed on the silicon layer. Next, a dichlorosilane based tungsten-silicide layer is formed on the monosilane based tungsten-silicide layer.

17 Claims, 3 Drawing Sheets

OTHER PUBLICATIONS

Joshi, R.V., et al.; "High Growth Rate CVD–W Process for Filling High Aspect Ratio Sub–Micron Contact/Lines"; *Mat. Res. Soc. Symp. Proc. VLSI V.* (1990); pp. 157–166.

Srinivas, D., et al.; "Kinetics of Low Pressure Chemical Vapor Deposition of Tungsten Silicide from Dichlorosilane Reduction of Tungsten Hexafluoride"; *Mat. Res. Soc. Symp. Proc. VLSI V.* (1990); pp. 407–413.

d'Heurle, F.M., et al.; "Observation on the Hexagonal Form of $MoSi_2$ and $WSi_2$ Films Produced by Ion Implantation and on Related Snowplow Effects", *J. Appl. Phys. 51(11)*, Nov. 1990; pp. 5976–5980.

Hara, T., et al.; "Composition of CVD Tungsten Silicides"; *J. Electrochem. Soc., Solid–State Science and Technology*, Mar. 1987; pp. 1302–1306.

Hara, T., et al.; "Deposition of Tungsten Silicide Films by the Chemical Vapor Reaction of Dichlorosilane and Tungstenhexafluoride"; *Japanese Journal of Applied Physics*, vol. 37, No. 10, Oct. 1988, pp. L1812–L1814.

Hara, T., et al.; "Tungsten Silicide Films Deposited by $SiH_2Cl_2$–$WF_6$ Chemical Reaction"; *J. Electrochem. Soc.*, vol. 136. No. 4, Apr. 1989; pp. 1177–1180.

Raupp, G.B., et al.; "Step Coverage of Tungsten Silicide Films Deposited by Low Pressure Dichlorosilane Reduction of Tungsten Hexafluoride"; *Thin Solid Films*, 193–194 (1990); pp. 234–243.

Sadana, D.K.; "Annealing and Oxidation Behavior of Low–Pressure Chemical Vapor Deposited Tungsten Slicide Layers on Polycrystalline Silicon Gates"; *J. Appl. Phys.* 62(7), Oct. 1987; pp. 2830–2835.

Saraswat, K. C., et al.; "Properties of Low–Pressure CVD Tungsten Silicide for MOS VLSI Interconnections"; *IEEE Transactions on Electron Devices*, vol. Ed–30, No. 11; Nov. 1983; pp. 1497–1505.

Schuegraf, K. K., ed; "Handbook of Thin–Film Deposition Processes and Techniques, Principles, Methods, Equipment and Applications"; 1988, pp. 254–257.

Selbrede, S.C.; "CVD of Tungsten Silicide Using Dichlorosilane"; *Semiconductor International*; Aug. 1988; pp. 88–92.

Shioya, Y., and Maeda M.; "Analysis of the Effects of Annealing on Resistivity of Chemical Vapor Deposition Tungsten–Silicide Films"; *J. Applied Phy.* 60(1), Jul. 1986; pp. 327–333.

Shioya, Y., et al.; "Effect of Fluorine in Chemical––Vapor–Deposited Tungsten Silicide Film on Electrical Breakdown of $SiO_2$ Film"; *J. Applied Phy.* 61(11), Jun. 1987; pp. 5102–5109.

Shioya, Y., et al.; "High–Temperature Stres Measurement on Chemical–Vapor Deposited Tungsten Silicide and Tungsten Films"; *J. Applied Phy.* 61(2), Jan. 1987; pp. 561–566.

Tsai, M.Y., et al.; "Properties of Tungsten Silicide Film on Polycrystalline Silicon"; *J. Applied Phy.* 52(8), Aug. 1981; pp. 5350–5355.

Washidzu, Gen, et al.; "In Situ Stress Measurement of Chemical Vapor Deposited Tungsten Silicides"; *Appl. Phys. Lett.* 58(13); Apr. 1991; pp. 1425–1427.

Wright, P.J. and Saraswat, K.C.; "The Effect of Fluorine in Silicon Dioxide Gate Dielectrics"; *IEEE Transactions on Electron Devices*, vol. 36, No. 5, May 1989; pp. 879–889.

Wu, T.H. and Rosler, R.S.; "Properties of $WSi_x$ Using Dichlorosilane in a Single–Wafer System"; *J. Vac. Sci. Technol*, B 6(6), Nov./Dec. 1988; pp. 1707–1713.

* cited by examiner

INTEGRATED TUNGSTEN-SILICIDE PROCESSES

This is a continuation of application Ser. No. 08/587,147, filed Jan. 16, 1996, now abandoned.

BACKGROUND OF THE INVENTION

1. Field of the Invention

The present invention relates to the field of thin films and their methods of manufacturing and more specifically, to composite silicon/tungsten-silicide thin films and their methods of fabrication.

2. Discussion of Related Art

As features of VLSI circuits continue to shrink, the necessity of decreasing the resistance associated with interconnection paths and gate electrodes becomes ever more pressing. Polysilicon has been widely used for many years in the formation of gate electrodes and interconnects. Polysilicon, however, has been somewhat limited by its high bulk resistivity of 0.7 mohm-cm. Polycide films, which consist of a low resistance silicide formed on top of a doped polysilicon film, have been used in place of polysilicon films in an attempt to further decrease the resistance of gate electrodes and interconnects to thereby create faster and lower power consuming integrated circuits.

A polycide film comprising a tungsten-silicide layer formed on a doped polysilicon layer has been widely used as gate electrodes and interconnections in many metal oxide semiconductor (MOS) processes. In the fabrication of a doped polysilicon/tungsten-silicide gate electrode, as shown in FIG. 1a, a doped polysilicon layer 104 of approximately 1000 angstroms (Å) is blanket deposited onto a gate dielectric layer 102 formed over the surface of a wafer or substrate 100. A tungsten-silicide layer 106, of the same order of magnitude in thickness as polysilicon layer 104 is then deposited over doped polysilicon layer 104 to form a "polycide" stack 108. Tungsten-silicide layer 106 can be formed by chemical vapor deposition (CVD) utilizing a reduction reaction of monosilane ($SiH_4$) and tungsten hexafluorine ($WF_6$). Such a deposition technique forms a good quality film having a uniform thickness across the surface of the wafer and a relatively smooth top surface. Unfortunately, however, utilizing a $SiH_4$ reduction of $WF_6$ to form tungsten-silicide layer 106 incorporates a substantial amount of fluorine atoms into the tungsten-silicide layer which can later damage or destroy fabricated devices.

In order to reduce fluorine incorporation, tungsten-silicide layer 110 can be formed by CVD utilizing a reduction reaction of dichlorosilane (DCS or $SiH_2Cl_2$) and tungsten hexafluorine ($WF_6$). Although such a DCS based reaction substantially eliminates fluorine incorporation, the film is of low quality because dopant impurities in polysilicon layer 104 prevent good nucleation from occurring. As a result, as shown in FIG. 1b, the film forms nonuniformly over the surface of the wafer and has an unacceptably rough surface. Such a polycide film 112 is unacceptable for VLSI manufacturing. Another problem associated with forming a DCS based tungsten-silicide layer on a doped polysilicon layer is that such a deposition technique can form a tungsten rich interface which is known to negatively impact device performance and cause reliability problems such as electromigration and high film stress. The presence of polysilicon dopants at the interface can also lead to the formation of an undesired tungsten rich interface.

It has been discovered that in order to produce a tungsten-silicide film of good quality by a DCS reduction of $WF_6$, it is necessary to form a thin, at least 150 Å, undoped polysilicon capping layer 114 on doped polysilicon layer 104. Undoped polysilicon capping layer 114 provides a barrier between the dopant impurities in doped polysilicon layer 104 and DCS based tungsten-silicide film 116. In this way, a DCS based tungsten-silicide film 116 can be formed with good uniformity and a substantially smooth surface across a wafer. Unfortunately, however, such a technique is only viable for polycide films 120 having a thickness greater than 1000 Å. For thinner films, less than 1000 Å, the undoped capping layer 114, which must still be at least 150 Å to produce a sufficient barrier, comprises too much of the total film thickness and results in a substantial reduction in the total dopant concentration of the polycide film 120 which in turn results in an increase in total resistance. Attempts to further increase the doping concentration level of the polysilicon layer 104 to offset capping layer 114 results in dopant diffusion into gate oxide 102 and consequently to device performance degradation and damage.

Thus, what is desired is a method of forming a thin low resistance polycide film having a uniform thickness and a smooth top surface which does not incorporate an undesirable amount of fluorine, and which does not have a tungsten rich interface.

SUMMARY OF THE INVENTION

Methods of forming a silicide on a doped silicon layer, without an undoped silicon cap are described. In a first method, a doped silicon layer is exposed to a first gas mix comprising monosilane ($SiH_4$) to form a monosilane exposed doped silicon surface. Next, a first tungsten-silicide layer, formed by a reduction reaction of $SiH_4$ and $WF_6$, is formed on the monosilane exposed silicon surface. A second tungsten-silicide layer, formed by a reduction reaction of $SiH_2Cl_2$ and $WF_6$, is then formed on the first tungsten-silicide layer. In a second method, a doped amorphous silicon layer is formed. A tungsten-silicide layer, formed by a reduction reaction of $SiH_2Cl_2$ and $WF_6$, is then deposited onto the amorphous silicon layer.

BRIEF DESCRIPTION OF THE DRAWINGS

FIG. 2b is an illustration of a cross-sectional view showing a monosilane pretreatment of the polysilicon layer on the substrate of FIG. 2a.

FIG. 3b is an illustration of a cross-sectional view showing the formation of a dichlorosilane based tungsten-silicide layer on the substrate of FIG. 3a.

DETAILED DESCRIPTION OF THE PRESENT INVENTION

Novel silicon/tungsten-silicide composite thin films and their methods of fabrication are described. In the following description, numerous specific details are set forth, such as specific materials, thicknesses, and process parameters, in order to provide a thorough understanding of the present invention. It will be obvious, however, to one skilled in the art that the present invention may be practiced without these specific details. In other instances, other well known semiconductor processes and machinery have not been described in particular detail in order to avoid unnecessarily obscuring the present invention.

The first embodiment of the present invention describes a novel method of forming a novel composite film comprising a lower silicon layer, an interfacial tungsten-silicide layer formed by chemical vapor deposition (CVD) utilizing a process gas mix of monosilane ($SiH_4$) and tungsten hexafluorine ($WF_6$), and a top tungsten-silicide layer formed by CVD utilizing a process gas mix comprising dichlorosilane (DCS or $SiH_2Cl_2$) and $WF_6$. The novel composite film of the present invention can be formed thin (less than 1000 Å), and uniformly over the entire surface of a wafer. The film is characterized by a smooth top surface and a low sheet resistance. The composite film of the present invention is ideally suited for use as a gate electrode or as an interconnection in an integrated circuit such as a microprocessor or memory device, but may be used in other polycide applications, if desired.

The present invention will be explained with respect to the formation of a polycide film to be used as a gate electrode in a metal oxide semiconductor (MOS) integrated circuit. In such a process, a semiconductor substrate or wafer 200 is provided. It is to be appreciated that substrate 200 is preferably a single crystalline silicon substrate doped to a suitable concentration level and may include well known wells and field isolation regions and other conventional features. A gate dielectric layer 202, such as $SiO_2$, having a thickness less than 100 Å, is formed over substrate 200.

Figure 1A:
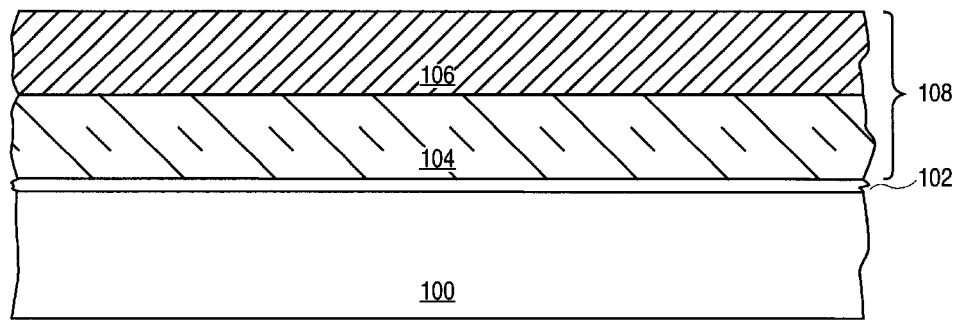
FIG. 1a is an illustration of a cross-sectional view showing a polycide film comprising a doped polysilicon layer and a tungsten-silicide layer formed from $SiH_4$ and $WF_6$.
Figure 1B:
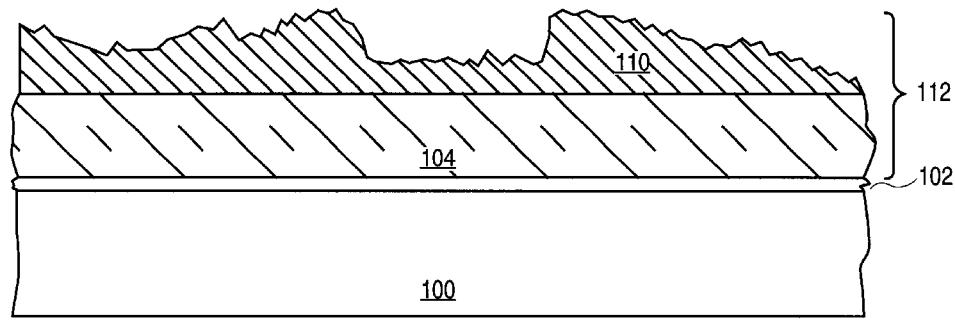
FIG. 1b is an illustration of a cross-sectional view showing a polycide film comprising a doped polysilicon layer and a tungsten-silicide layer formed from $SiH_2Cl_2$.
Figure 1C:
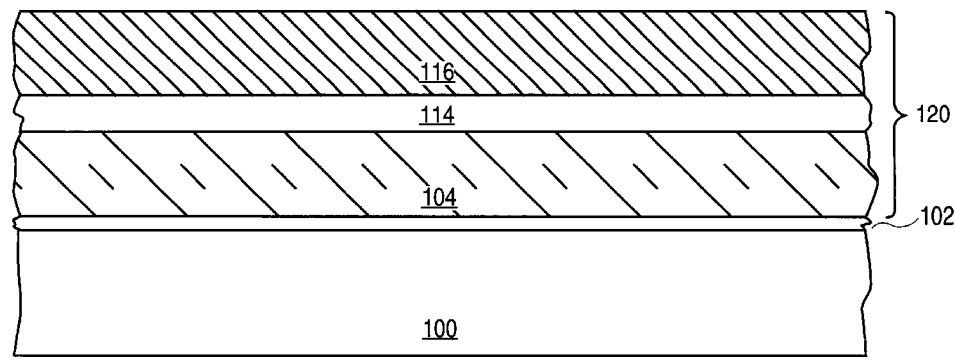
FIG. 1c is an illustration of a cross-sectional view showing a polycide film comprising a doped polysilicon layer, an undoped polysilicon capping layer, and a tungsten-silicide layer formed from $SiH_2Cl_2$ and $WF_6$.
Figure 2A:
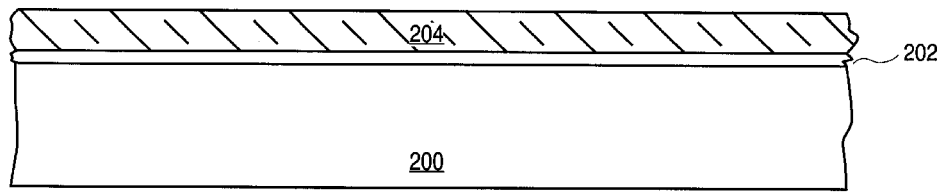
FIG. 2a is an illustration of a cross-sectional view showing a gate dielectric layer formed on a substrate and a doped polysilicon layer formed on the gate dielectric layer.

Next, as shown in FIG. 2a, a silicon layer 204 is formed over gate dielectric layer 202. According to the preferred embodiment of the present invention, silicon layer 204 is a polycrystalline silicon layer (polysilicon) doped with impurities, such as phosphorous, to a concentration level between $1\times10^{20}/cm^3-6\times10^{20}/cm^3$. Silicon layer 204 is preferably a polycrystalline silicon layer formed to a thickness of approximately 500 Å or less (for a polycide film of 1000 Å or less) by chemical vapor deposition (CVD) in a separate chamber of the same cluster tool used to deposit the subsequently deposited tungsten-silicide layers described below.

It is to be appreciated that according to the first embodiment of the present invention, silicon layer 204 need not necessarily be a polysilicon layer, but may be any other type of silicon layer, such as amorphous silicon, if desired. Additionally, silicon layer 204 need not necessarily be a highly doped silicon layer and may be a low doped or undoped layer, if desired. It is to be appreciated, however, that an advantage of the present invention is its ability to form a uniform, high quality, tungsten-silicide film on a doped silicon layer. However, any well known silicon layer and method of fabrication may be used to form silicon layer 204.

Next, according to the first preferred embodiment of the present invention, substrate or wafer 200 is transferred from the polysilicon deposition chamber into a CVD tungsten-silicide deposition chamber such as available in a Centura high temperature film (HTF) tool available from Applied Materials of Santa Clara, Calif. The tungsten-silicide deposition chamber is preferably lamp heated and preferably has a gas delivery system through the lid with a susceptor to shower head spacing of approximately 475 mills. Additionally, the tungsten-silicide deposition chamber is preferably a single wafer chamber capable of being evacuated to less than 0.2 T. Additionally, the gas delivery system is coupled to and can supply sufficient volumes of the following process gases: $SiH_4$, $SiH_2Cl_2$, and $WF_6$, and is coupled to and can supply sufficient volumes of an inert gas or gases such as argon (Ar), helium (He), and nitrogen ($N_2$).

Figure 2B:
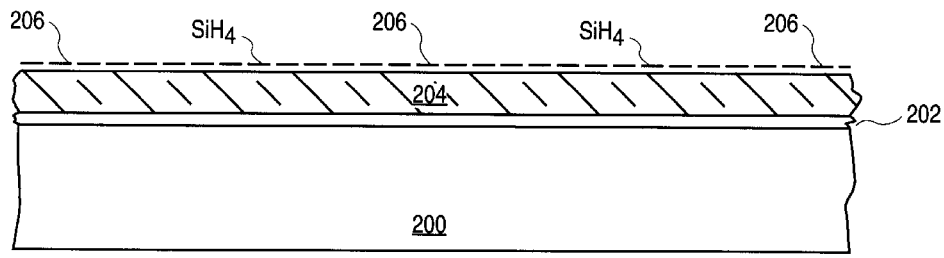

Next, as shown in FIG. 2b, polysilicon layer 204 is preconditioned by exposing polysilicon layer 204 to a gas comprising monosilane ($SiH_4$). The goal of the monosilane pretreatment (or "monosilane soak") is to form a uniform layer (tens of Angstroms) of monosilane 206 across the surface of polysilicon layer 204 prior to flowing a source of tungsten into the deposition chamber. In this way, when $WF_6$ is subsequently flowed into the deposition chamber, a uniform layer of monosilane is already provided across the surface of the polysilicon layer 204 allowing for a uniform deposition of tungsten-silicide on polysilicon layer 204. Although preconditioning polysilicon layer 204 is desired to help achieve good tungsten-silicide deposition, it is not required to practice the present invention.

Preconditioning of polysilicon layer 204 can be accomplished by flowing between 100–1000 sccm of monosilane, with 300 sccm being preferred, into the deposition chamber, at a temperature between 450–625° C. with 550° C. being preferred, for a time between 560 seconds with 40 seconds being preferred.

The preconditioning step occurs at a pressure between 0.5–15 T with one T being preferred. It is to be appreciated that preconditioning polysilicon layer 204 at too high of a pressure can cause undesirable silicon deposition and subsequent tungsten-silicide deposition on chamber walls and windows and on the backside of the susceptor. Argon can be included in the monosilane preconditioning gas mix in order to help prevent undesired silicon formation in the chamber.

Figure 2C:
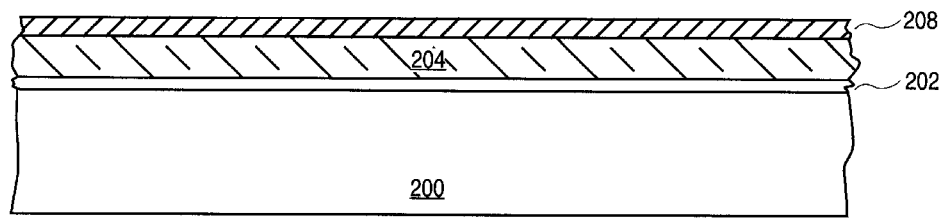
FIG. 2c is an illustration of a cross-sectional view showing the formation of a tungsten-silicide layer from a reaction of $SiH_4$ and $WF_6$ on the substrate of FIG. 2b.

Next, as shown in FIG. 2c, a thin monosilane ($SiH_4$) based tungsten-silicide layer 208 is formed onto polysilicon layer 204. The purpose of monosilane based tungsten-silicide layer 208 is to provide an interfacial layer which has a uniform thickness, a smooth surface, and a consistent resistivity across the surface of wafer 200. Tungsten-silicide layer 208 is formed by chemical vapor deposition (CVD) utilizing a reduction reaction of monosilane ($SiH_4$) and $WF_6$. Monosilane based tungsten-silicide layer 208 is deposited to a thickness between 10–500 Å with 100 Å being preferred. Tungsten-silicide layer 208 is formed thick enough to uniformly form at least one or two monolayers of tungsten-silicide onto polysilicon layer 204 but yet is kept thin enough so as to limit the amount of fluorine incorporated into the deposited film. Because tungsten-silicide layer 208 is formed onto a monosilane exposed polysilicon surface 206, a thin uniform layer of tungsten-silicide 208 can be reliably formed across the surface of wafer 200.

Monosilane based tungsten-silicide layer 208 is preferably deposited insitu (i.e. in the same chamber and immediately after) the monosilane preconditioning step. Tungsten-silicide layer 208 is preferably formed by introducing a gas mix comprising approximately four sccm of $WF_6$ and approximately 300 sccm of monosilane into a reaction chamber for approximately two-three seconds at a pressure between 0.2–10 T with one-two T being preferred and at a temperature between 450–625° C. with 550° C. being preferred. An inert gas or gases such as argon, helium and nitrogen can be included into the gas mix in order to prevent undesired tungsten-silicide deposition onto the reaction chamber and to provide a carrier for $WF_6$, if desired.

It is to be appreciated that the reaction of $SiH_4$ and $WF_6$ produces tungsten-silicide ($WSi_x$) where $X \geq 2.0$. As such, the resistivity of the deposited tungsten-silicide film 208 can be tailored to specific needs by adjusting the gas ratio of $SiH_4:WF_6$. The greater the flow of $SiH_4$ relative to $WF_6$, the greater will be the silicon content in the tungsten-silicide film. The greater the silicon content in the film, the higher will be the resistivity of the film. Additionally, tungsten-silicide layer 208 is preferably deposited so that it has a flat Si:W composition ratio (i.e. the Si:W ratio is substantially the same throughout the thickness of the film).

Figure 2D:
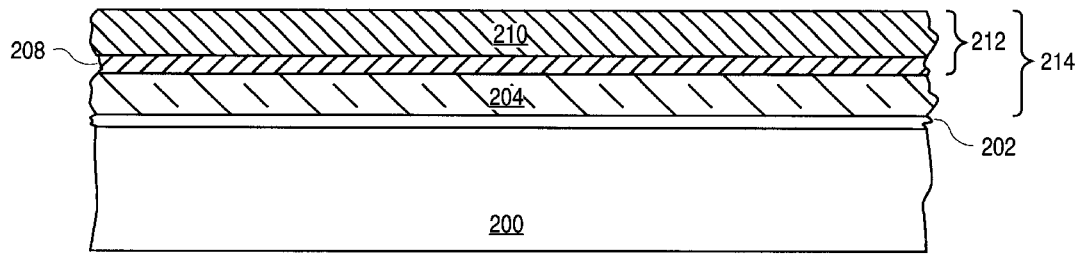
FIG. 2d is an illustration of a cross-sectional view showing the formation of a tungsten-silicide layer from a reaction of $SiH_2Cl_2$ and $WF_6$ on the substrate of FIG. 2c.

Next, as shown in FIG. 2d, a dichlorosilane (DCS or $SiH_2Cl_2$) based tungsten-silicide layer 210 is formed onto monosilane based tungsten-silicide layer 208. Tungsten-silicide layer 210 is formed by chemical vapor deposition utilizing a reduction reaction of $WF_6$ and DCS and is preferably formed insitu (i.e. in the same chamber and immediately after) monosilane based tungsten-silicide layer 208. In order to reduce the fluorine content in the polycide film, DCS based tungsten-silicide layer 210 makes up the bulk of the dual layer tungsten-silicide film 212. DCS based tungsten-silicide layer 210 is preferably formed to a thickness between 300–700 Å for a 1000 Å polycide film. For a polycide stack greater than 1000 Å, DCS based tungsten-silicide layer 210 should preferably be formed to a thickness greater than 500 Å.

The gas flow ratio of $DCS:WF_6$ can be chosen to obtain a desired tungsten-silicide composition ratio and therefore a desired resistivity of tungsten-silicide film 210. Because DCS based tungsten-silicide film 210 comprises the bulk of the dual layer tungsten film 212, it must be formed to a thickness and with the appropriate Si:W composition ratio to obtain the desired resistivity and thickness for polycide film 214.

DCS based tungsten-silicide layer 210 can be formed by flowing a gas mix comprising approximately 200 sccm of DCS and approximately 4 sccm of $WF_6$ into a reaction chamber at a pressure between 0.2–10 T with approximately one T being preferred, and at a temperature between 450–625° C. with 550° C. being preferred. An inert gas or gases, such as argon, helium and nitrogen, can be included in the gas mix in order to prevent undesired tungsten-silicide deposition onto the reaction chamber and to provide a carrier for $WF_6$, if desired. It is to be appreciated that DCS based tungsten-silicide film 210 is able to be formed uniformly and with a smooth surface because interfacial monosilane based tungsten-silicide layer 208 prevents interaction with doped polysilicon layer 204.

It is to be noted that it is undesirable to have a tungsten rich interface between dual layer tungsten-silicide film 212 and polysilicon layer 204. A tungsten rich interface can cause electromigration which can lead to void formation which in turn can cause open circuits. Additionally, a tungsten-rich interface can result in a high film stress which can lead to peeling. As such, according to the first preferred embodiment of the present invention, deposition parameters are chosen so as to form a monosilane based tungsten-silicide layer 208 with a Si:W content ratio greater than or equal to the Si:W content ratio of the DCS based tungsten-silicide layer 210. That is, monosilane based tungsten-silicide layer 208 is preferably the same as or more silicon rich than DCS based tungsten-silicide layer 210.

After deposition of DCS based tungsten-silicide layer 210, a "monosilane cap" can be formed on DCS based tungsten-silicide layer 210, if desired. Flowing monosilane over tungsten-silicide layer 210 allows any loose tungsten bonds to react with monosilane and form tungsten-silicide. Forming a "monosilane cap" helps reduce stress in the DCS based tungsten-silicide layer. A "monosilane cap" can be formed insitu by flowing approximately 200 sccm of monosilane for approximately 15 seconds into the tungsten-silicide deposition chamber at a pressure of approximately one T and at a temperature of approximately 550° C.

After formation of a "monosilane cap," substrate 200 is removed from the tungsten-silicide deposition chamber. Substrate 200 is then eventually annealed to activate and drive dopants in polysilicon layer 204 and to alter the stoichiometry of tungsten-silicide films 208 and 210, from $WSi_x$ $X \geq 2.0 \leq 3.5$ to $WSi_x$ $X \approx 2.0$ which reduces the sheet resistance of the polycide film. Any well known anneal method and apparatus can be used to anneal substrate 200, such as a Rapid Thermal Anneal (RTA), at approximately 1000° C., in a nitrogen ambient, for a time between 30–60 seconds, or a standard furnace anneal at 850° C. for 30 minutes.

At this point, the formation of a novel polycide film comprising a doped polysilicon layer 204 and interfacial monosilane based tungsten-silicide layer 208, and a bulk DCS based tungsten-silicide layer 210 is now complete. The low resistance monosilane based tungsten-silicide interfacial layer of the first embodiment of the present invention enables a thin (less than 1000 Å), low resistance (600–1500 $\mu\Omega$-cm) polycide film to be formed uniformly across the surface of a wafer without substantial fluorine incorporation therein. Conventional photolithographic and etching techniques can be used to pattern polycide film 214 into a plurality of gate electrodes. Well known doping and interconnection techniques can then be utilized to complete the fabrication of an integrated circuit.

A second embodiment of the present invention describes a novel composite film comprising a lower amorphous silicon layer and a top tungsten-silicide layer formed by CVD utilizing a process gas mix comprising dichlorosilane (DCS) and tungsten hexafluorine ($WF_6$). The novel composite film of the second preferred embodiment of the present invention can be formed thin (less than 1000 Å) and uniformly across the surface of a wafer. The thin film is characterized as having a smooth top surface and a low sheet resistance. Additionally, the film can be formed without undesirable fluorine incorporation.

According to the second method of the present invention, an amorphous silicon layer 304 is blanket deposited onto gate dielectric layer 202 formed on substrate 200. Amorphous layer 304 is preferably formed to a thickness of less than 500 Å by chemical vapor deposition (CVD) and is insitu doped with impurities, such as phosphorous, to a concentration level between $1 \times 10^{20}/cm^3$ to $6 \times 10^{20}/cm^3$. Amorphous silicon layer 304 can be formed by CVD by flowing monosilane ($SiH_4$), $H_2$, and a dopant source, such as phosphine, into a reaction chamber at a pressure between 3–200 T and at a temperature between 600–630° C. Any well known method, however, can be utilized to form amorphous silicon layer 304.

Figure 3A:
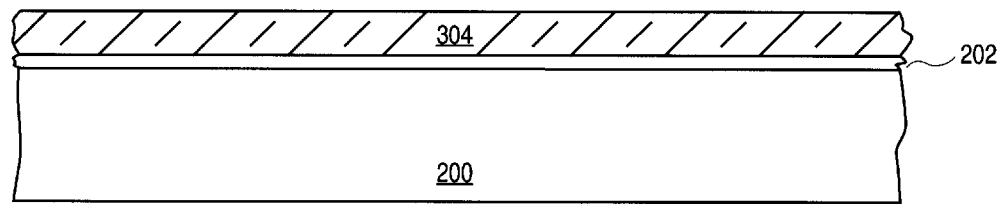
FIG. 3a is an illustration of a cross-sectional view showing the formation of an amorphous silicon layer on a substrate.
Figure 3B:
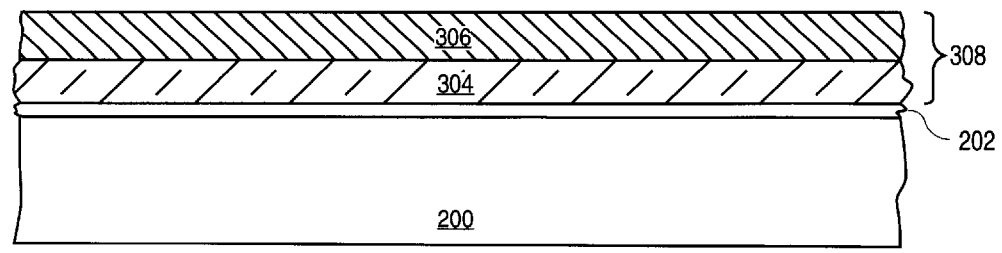

Next, as shown in FIG. 3b, substrate 200 is transferred into a tungsten-silicide deposition chamber such as described above. A dichlorosilane ($SiH_2Cl_2$ or DCS) based tungsten-silicide layer 306 is then deposited onto amorphous silicon layer 304. DCS based tungsten-silicide layer is formed by chemical vapor deposition utilizing a reduction reaction of $WF_6$ and DCS. The gas flow ratio of DCS:$WF_6$ is chosen to obtain a desired Si:W composition ratio and therefore the desired resistivity of tungsten-silicide film 306. DCS based tungsten-silicide 306 is preferably formed so as to generate has a flat Si:W composition ratio.

DCS based tungsten-silicide layer 306 is preferably deposited to a thickness less than 500 Å by flowing a gas mix comprising approximately 200 sccm of DCS and approximately four sccm of $WF_6$ into a reaction chamber at a pressure between 0.2–10 T with approximately one T being preferred, and at a temperature between 450–625° C. with 550° C. being preferred. An inert gas or gases such as argon, helium, and nitrogen can be included in the gas mix in order to prevent undesired tungsten-silicide deposition on the reaction chamber and to provide a carrier for $WF_6$.

It is to be noted that DCS based tungsten-silicide layer 306 can be formed uniformly and with a smooth surface, as shown in FIG. 3b, because it is formed onto a doped amorphous silicon layer as opposed to a doped polysilicon layer. Because amorphous silicon is devoid of a long range periodic structures, it has few grain boundaries. Because amorphous silicon lacks substantial grain boundaries, dopants are unable to readily diffuse to the surface where they can inhibit nucleation and therefore good film growth. Thus, by forming DCS based tungsten-silicide layer 306 directly onto amorphous silicon layer 304, a smooth and uniform tungsten-silicide layer can be grown without the need for a "capping" layer as required with doped polysilicon.

In order to prevent a tungsten rich interface, and initial nucleation step may be utilized prior to deposition of DCS based tungsten-silicide layer 308, if desired. Such a nucleation step would occur for approximately 20 seconds and would utilize the same process gases and parameters as DCS based tungsten-silicide film 306, except that the nucleation step would occur at a slightly higher pressure, approximately 1.5 T in the preferred embodiment, than the bulk deposition, which in the preferred embodiment is one T.

Additionally, after deposition of DCS based tungsten-silicide layer 306, a "monosilane cap" can be formed on DCS based tungsten-silicide layer 306, if desired. Flowing monosilane over tungsten-silicide layer 306 allows any loose tungsten bonds to react with monosilane and form tungsten-silicide. A monosilane cap can be formed as described above.

After formation of a "monosilane cap," substrate 200 is removed from the tungsten-silicide deposition chamber. Substrate 200 is then eventually annealed to activate and drive the dopants in amorphous silicon layer 304 and to alter the stoichiochemistry of DCS based tungsten-silicide film 306 to decrease its resistance. Any well known anneal method and apparatus can be utilized to anneal substrate 200, such as a rapid thermal anneal (RTA), at approximately 1000° C., in a nitrogen ambient, for a time between 30–60 seconds, or a standard furnace anneal. It is to be appreciated that the anneal step converts amorphous silicon 304 into polycrystalline silicon.

At this time, the formation of a novel amorphous silicon/DCS based tungsten-silicide composite film 308 is now complete. The novel silicon/tungsten-silicide composite film 308 can be formed thin (less than 1000 Å) and uniformly across the surface of a wafer. Very little, if any, fluorine is incorporated into a composite film 308 because tungsten-silicide layer 306 is deposited from DCS. Conventional patterning, doping, and interconnection techniques can be used to complete the fabrication of an integrated circuit.

It is to be noted that although the present invention has been described with respect to the formation of a gate electrode, the processes of the present invention can be used anywhere low resistance silicon films are needed, such as interconnects. Additionally, although the present invention has been described with respect to the formation of thin (less than 1000 Å) films, the present invention can be used to form films with thicknesses greater than 1000 Å. As such, the detailed description of the present invention is to be taken as illustrative rather than limiting whereby the scope of the present invention is to be measured by the appended claims which follow.

Thus, thin, low resistance silicon/tungsten-silicide composite films and their methods of fabrication have been described.

What is claimed is:

1. A method of forming a silicide on a silicon layer comprising the steps of:

forming a first tungsten-silicide layer on said silicon layer wherein said first tungsten-silicide layer consists of monosilane ($SiH_4$) based tungsten-silicide;

forming a second tungsten-silicide layer on said first tungsten-silicide layer wherein said second tungsten-silicide layer is formed from a gas mix comprising dichlorosilane (DCS); and wherein said first tungsten-silicide layer prevents DCS based tungsten-silicide from interacting with said silicon layer.

2. The method of claim 1 further comprising the step of:

exposing said silicon layer to a third gas comprising monosilane ($SiH_4$) prior to forming said first tungsten-silicide layer.

3. The method of claim 1 further comprising the step of exposing said second tungsten-silicide layer to a fourth gas comprising silane.

4. The method of claim 1 wherein said first gas mix further comprises $WF_6$ and said first gas mix has a $WF_6$:$SiH_4$ ratio of approximately 1:100.

5. The method of claim 1 wherein said first tungsten-silicide layer is formed at a pressure between 0.2–10 T and at a temperature between 450–625° C.

6. The method of claim 1 wherein said first tungsten-silicide layer has a Si:W ratio greater than or equal to the Si:W ratio of said second tungsten-silicide layer.

7. The method of claim 1 wherein said silicon layer is polycrystalline silicon.

8. The method of claim 1 wherein said silicon layer is amorphous silicon.

9. A method of forming a silicide on a doped polysilicon layer comprising the steps of:

forming a first tungsten-silicide layer on said doped polysilicon surface, said first tungsten-silicon layer consisting essentially of tungsten silicide formed from a reduction reaction of $SiH_4$ and $WF_6$; and forming a second tungsten-silicide layer on said first tungsten-silicide layer wherein said second tungsten-silicide layer is formed from a reduction reaction of DCS and $WF_6$ and wherein said first tungsten-silicide layer prevents DCS based tungsten-silicide from interacting with said doped polysilicon layer.

10. The method of claim 9 wherein said first tungsten-silicide layer is formed to a thickness of approximately 100 Å.

11. The method of claim 9 wherein said first tungsten-silicide layer is formed from a gas mix having a $WF_6:SiH_4$ ratio of approximately 1:100.

12. The method of claim 9 wherein said first tungsten-silicide layer has a Si:W ratio greater than or equal to the Si:W ratio in said second tungsten-silicide layer.

13. The method of claim 9 further comprising the step of exposing said second tungsten-silicide layer to a second gas mix comprising silane.

14. A method of forming a silicide layer on a doped polysilicon layer, said method comprising the steps of:

forming an interfacial tungsten-silicide layer on said doped polysilicon layer; and forming a DCS based tungsten-silicide layer on said interfacial tungsten-silicide layer wherein said interfacial tungsten-silicide layer prevents DCS based tungsten-silicide from interacting with said doped polysilicon layer.

15. The method of claim 14 wherein said interfacial tungsten-silicide layer is between 10–500 Å thick.

16. The method of claim 14 wherein said interfacial tungsten-silicide layer and said DCS based tungsten-silicide layer are formed in-situ.

17. The method of claim 14 wherein said interfacial tungsten-silicide layer has a Si:W content ratio greater than or equal to the Si:W content ratio of said DCS based tungsten-silicide layer.

* * * * *